(12) United States Patent
Chen et al.

(10) Patent No.: US 6,960,532 B2
(45) Date of Patent: Nov. 1, 2005

(54) SUPPRESSING LITHOGRAPHY AT A WAFER EDGE

(75) Inventors: Linda A. Chen, Hopewell Junction, NY (US); Wai-Kin Li, Poughkeepsie, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 320 days.

(21) Appl. No.: 10/248,911

(22) Filed: Feb. 28, 2003

(65) Prior Publication Data

US 2004/0171267 A1   Sep. 2, 2004

(51) Int. Cl.⁷ ............................................. H01L 21/302
(52) U.S. Cl. ..................................... 438/706; 438/719
(58) Field of Search ................................ 438/706, 710, 438/712, 714, 719, 723, 724, 725; 430/311, 430/313

(56) References Cited

U.S. PATENT DOCUMENTS

| | | | | |
|---|---|---|---|---|
| 5,405,734 A | * | 4/1995 | Aita | 430/323 |
| 5,866,481 A | * | 2/1999 | Tsai et al. | 438/694 |
| 6,507,034 B1 | * | 1/2003 | Nakasugi | 250/492.22 |
| 6,520,844 B2 | * | 2/2003 | Iwasaki et al. | 451/285 |
| 6,713,236 B2 | * | 3/2004 | Chen | 430/313 |
| 2004/0005516 A1 | * | 1/2004 | Chen | 430/313 |

* cited by examiner

Primary Examiner—Kin-Chan Chen
(74) Attorney, Agent, or Firm—Todd M. C. Li

(57) ABSTRACT

Damage to the rim of a semiconductor wafer caused by etching processes is reduced by forming a rim of carbonized photoresist around the outer edge of the wafer, using a wafer edge tool to carbonize the outer rim of a positive tone photoresist.

13 Claims, 3 Drawing Sheets

SUPPRESSING LITHOGRAPHY AT A WAFER EDGE

BACKGROUND OF INVENTION

The field of the invention is that of lithography in integrated circuit processing, in particular in patterning a wafer before an etch step.

In the course of processing integrated circuits, a standard sequence is that of putting down a layer of material, then depositing a layer of photoresist, patterning the photoresist by projecting a pattern on it and developing the resist to produce a pattern of open areas that expose the material, with the other areas still covered by the resist.

The etching process generates heat, so that it is preferred to extend the pattern to the edges of the wafer, even though the particular integrated circuit at the edge will not fit on the wafer and therefore cannot be used. The reason for this is that performing the etching at the edge tends to spread out the heat produced by the etching more uniformly than if this were not done, thus reducing stress on the wafer and the possibility of distortion.

A drawback of this approach is that, while it accomplishes its primary purpose of reducing stress, it sometimes permits or encourages the development of closely spaced sets of narrow cracks in the silicon wafer material, referred to as "Black" silicon, since it absorbs light very strongly. The narrow slivers of silicon between the cracks tend to break off, producing particles that cause defects in the integrated circuit, and other problems.

Some etching tools have "shadow rings", circular pieces of an etch-resistant material that blocks the etching process at the edge, as shown in FIG. 8 and discussed later. These tools have problems if the shadow ring contacts the wafer, which would contaminate the tool. Another drawback of using rings is that etching uniformity is degraded. In addition, the rings, being mechanical objects, are not positioned as precisely as the lithographic patterns, requiring that space be left as a buffer between the ring position and the closest chip on the wafer.

The black silicon phenomenon is a problem only very close to the edge of a wafer, about 5 mm in current technology. It would be desirable to be able to block the etching in deep trench etching steps as required with a controllable pattern that can be aligned with great precision.

SUMMARY OF INVENTION

The invention relates to a method of blocking etching in a localized region of a wafer by damaging the resist used in patterning the wafer.

A feature of the invention is blocking etching at the rim of the wafer.

A feature of the invention is the use of the same photoresist that is used in the etching pattern.

Another feature of the invention is the use of an etch-resistant blocking layer.

Yet another feature of the invention is the removal of the blocking layer after a deep trench etching step.

DETAILED DESCRIPTION

The following describes an example of a process according to the invention. A semiconductor wafer, e.g. Silicon, Gallium Arsenide, Silicon-Germanium alloy, Silicon on insulator, etc. is prepared according to the requirements of the circuit being fabricated and the technology in use.

Figure 1:
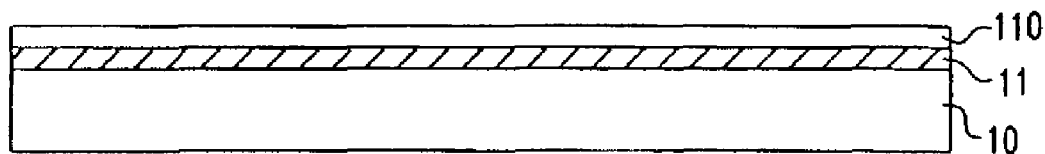
FIG. 1 shows a cross section of a wafer prepared for the invention.

A substrate or integrated circuit wafer 10 has a layer 11 on top that represents schematically the pad nitride, pad oxide, and other preliminary layers, as shown in FIG. 1. The dimensions in the Figures are not to scale. In the case of a three hundred millimeter diameter wafer, the relative proportion of the blocking material to be formed at the rim to be defined, the thickness of the material and the diameter of the wafer will be as discussed below. The dimensions shown in the drawing are selected for convenience in presentation and explanation.

A thick layer of positive photoresist 110 has been spun-on and prepared conventionally to be exposed and developed. In this case, it is a positive resist that is used to define deep trench patterns in DRAMs or embedded DRAM arrays. The pattern could be any pattern that potentially causes the problem of black silicon.

Figure 2:
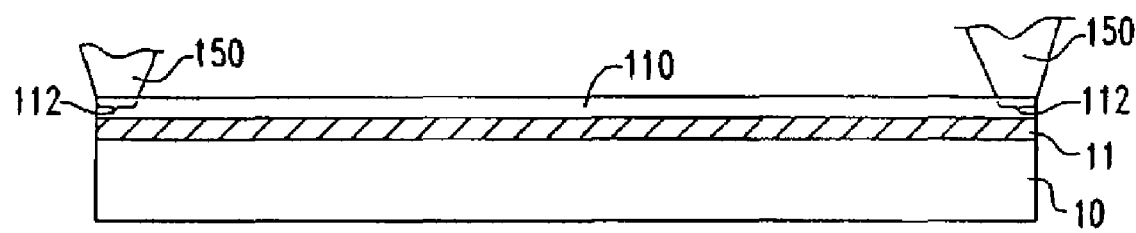
FIG. 2 shows the same area after exposure of the blocking layer.

Next, as shown in FIG. 2, photoresist 110 is exposed at the rim over a radial distance 112 at the base of radiation beam 150 to define a rim 115 that goes around the outer edge of wafer 10. The exposure of beam 150 will preferably be sufficient to carbonize the resist 110 over that area. The distance 112 will preferably be uniform, but may be made non-uniform, as discussed below.

Figure 3:
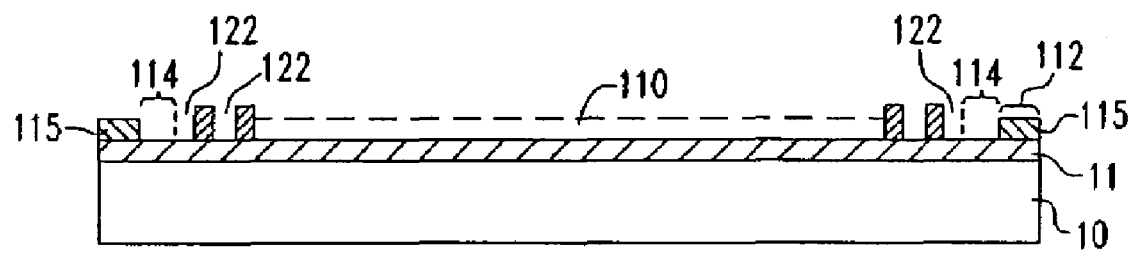
FIG. 3 shows the area after development of the resist material also used for the blocking layer.

FIG. 3 shows the result of exposing the central portion of the photoresist with the regular pattern and then developing it, in which the central part of the photoresist has a deep trench pattern of apertures 122 and the exposed part remains as a layer of blocking material in a blocking area, defining a central inner area inside the blocking area for the construction of the integrated circuits. Repetition over the entire diameter of the wafer of the structures shown at the edges is indicated by the horizontal dotted line.

Layer 111 represents the pad nitride and also represents an optional hardmask layer that can be etched through the openings in the photoresist and will then define the etching operation in the underlying silicon. The pattern shown in resist 110 is referred to as the component pattern. A hardmask is not always required and is used when the etching process is more aggressive or lasts for a long time, so that photoresist alone is not enough to withstand the effects of the etching material. Bracket 114 represents a margin between blocking material 115 and the closest part of a chip, to avoid damaging a chip by misalignment that puts it on the material 115.

Figure 4:
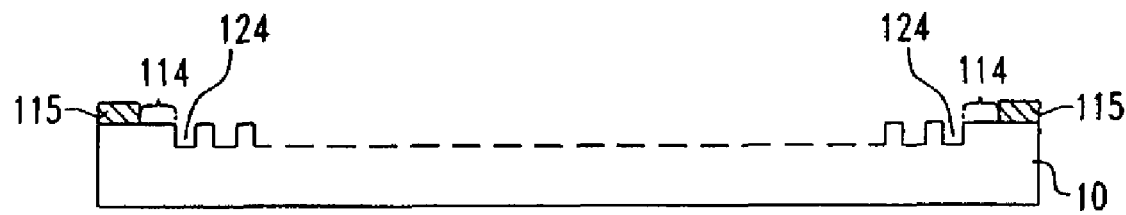
FIG. 4 shows the exposure of a wafer.

In FIG. 4, the same area is shown after the resist 110 has been patterned with the deep trench pattern and developed and the silicon in the wafer 10 has been etched, forming trenches 124. Repetition over the entire diameter of the wafer of the structures etched in the wafer and shown at the edges is indicated by the horizontal dotted line. On both sides, the rim 115 that has been carbonized by the edge exposure tool is separated from the patterned and etched area by the buffer distance 114.

The thickness of layer 110 will be determined by the requirements of the image being formed and the amount of etch resistance required. Since the photosensitive property of the photoresist has been destroyed by the process of carbonizing, the pattern does not develop in the rim. There is no remaining photoresist to protect the wafer from the etching gases, as there is in the center. The carbonized resist remains and that material is more resistant to the etching than the original photoresist. The etching process is more aggressive at the wafer rim than it is in interior locations, so that the etching gases may consume the carbonized material in places. It is an advantageous feature of the invention that the protection provided by the carbonized resist does not have to be perfect. The problem of black silicon does not arise when the etching gases first attack silicon, but only after some material has been attacked. Thus, the process according to the invention is tolerant of fluctuations in blocking material thickness, etch resistance, etching aggressiveness, etc.

The layer 115 will be stripped, e.g. in an oxygen plasma step, when no longer needed or when a chemical-mechanical polishing or other planarization step is to be performed that layer 115 would interfere with. If the layer has been completely consumed, then stripping is not required, but the operator cannot depend that it will be completely consumed.

In contemporary practice, the only etching process that suffers from the black silicon problem is deep trench etching, but new processes may have a similar problem with a different step. New layers 115 may be formed as needed, though the deep trench represents the heaviest load on the wafer, since it is the longest etching process.

The blocking layer can be applied in a single coating track, comprising the coating modules, hot plate modules, cool plate modules, developer units and a place for installing a wafer edge exposure module. A suitable tool that has been used for the invention is the ASML PAS5000 scanner.

The invention is illustrated with a Wafer Edge Tool that has been designed to expose photoresist in the ultraviolet, (UV 196 nm–400 nm). Since the resist is to be carbonized, it may be preferred to use a less expensive laser in the infra-red or visible, so long as it can deliver enough power in the applied radiation dose to carbonize the resist 110. Electron beam tools may also be used, for example if the process is using an electron beam tool to pattern the resist for the etching step.

The capability of dual-use (e.g. using the same wafer edge tool for the conventional wafer edge exposure and also for the inventive process) provides flexibility, but it may be that the use of a dedicated tool has a lower capital cost.

Figure 5:
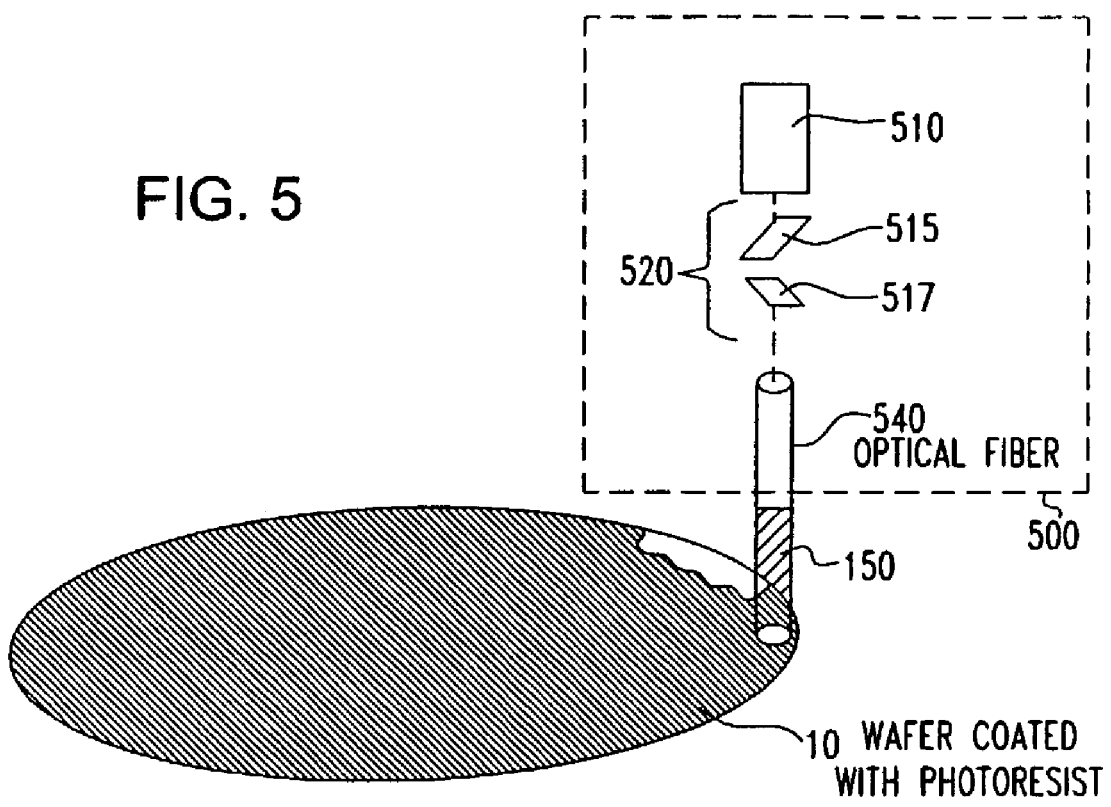
FIG. 5 shows a perspective view of apparatus for exposing a wafer.

FIG. 5 shows schematically the operation of a tool according to the invention. Laser 510 generates a beam in the UV range that enters optical fiber 540 that is positioned at the rim of wafer 10. The wafer is rotated underneath fiber 540, so that radiation from the fiber, as beam 150, strikes a strip at the rim of wafer 10. Mirrors 515 and 517 are part of an alternative version of the invention that is discussed below.

Figure 6A:
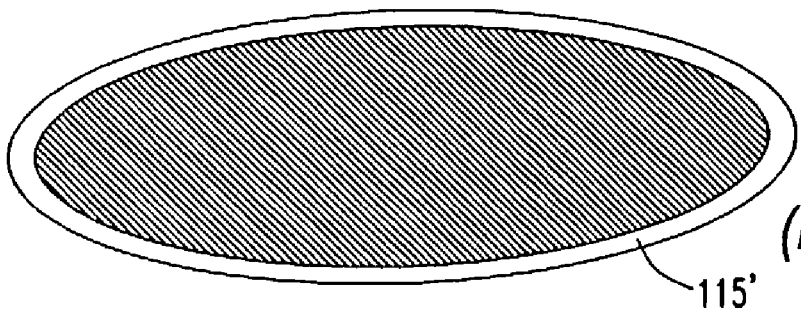
FIG. 6A shows the area after processing according to the prior art.

In the ordinary use of the tool, shown in FIG. 6A, the radiation in beam 150 exposes the positive resist 110 in a strip about the rim, so that the exposed resist, when developed, is removed from the rim, leaving a bare rim 115' where the wafer is exposed. That reduces the possibility of resist sticking to or otherwise contaminating other tools that come in contact with it.

Figure 6B:
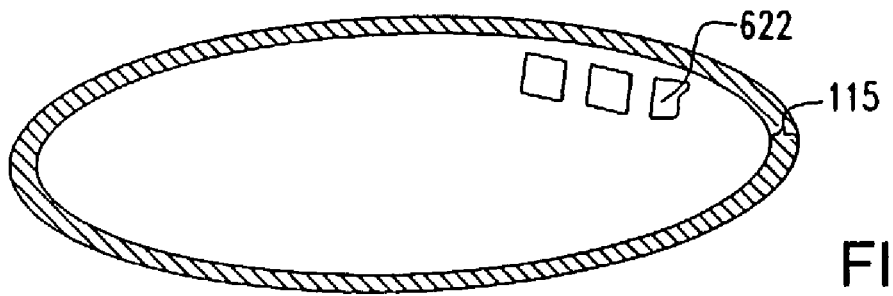
FIG. 6B shows the area after processing according to the invention.

According to the invention, the duration of the exposure and/or the intensity of the radiation is set such that the radiation carbonizes or otherwise desensitizes the resist in that area. "Carbonize" is a term well understood in the art that means that volatile compounds have been driven out of the material, leaving a tough residue that is largely carbon. Thus, when exposed according to the invention, the resist 110 leaves a carbonized residue, shown as rim 115 in FIG. 6B, in the area that usually is free from resist. When the resist in the central main portion of the wafer is exposed with the pattern of deep trenches, the rim is not developed, because the resist has been carbonized. Thus, the desired result is achieved—that the deep trenches are not etched in the carbonized rim.

The underlying silicon or other wafer material is protected from the etching gases by the carbonized residue and any optional hardmask that may be present. If a different etching process is used in some application that is not too aggressive and/or does not etch a thick layer, it may be sufficient to cross-link, develop or otherwise render the resist in that area insensitive (e.g. a negative resist that becomes etch-resistant on exposure).

Figure 8:
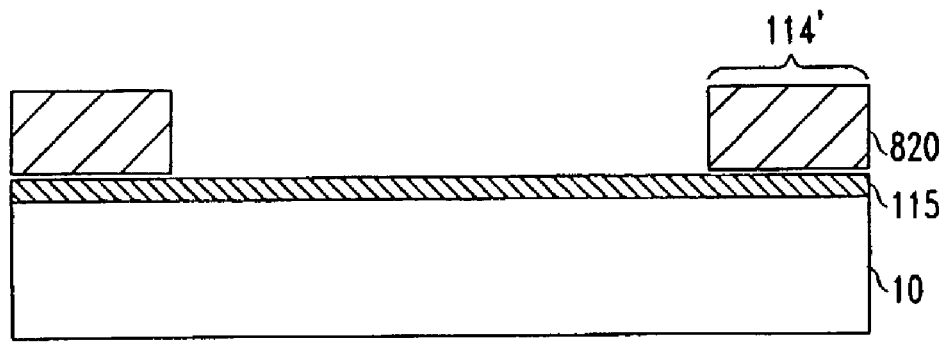
FIG. 8 shows a cross section of a wafer being processed according to the prior art.

Referring now to FIG. 8, there is shown in cross section a prior art approach to protecting the wafer edge during etching. A mechanical ring 820, made of stainless steel or another material that will withstand the etchant gases is positioned above the rim of wafer 10. The ring occupies a radial distance 112' sufficient to protect the edge, which will vary in different tools and different chemistries. The ring 820 is placed in position after the wafer is prepared with photoresist 110 and remains in position during the etching step, so that the etching gases do not attack the resist 110. The resist 110 underneath the ring has been developed because the area at the edge of the wafer was exposed in order to improve the uniformity of heat loading during the etch. Thus, there are apertures in the photoresist at the wafer edge that would be attacked and etched if the ring were not present.

Figure 9:
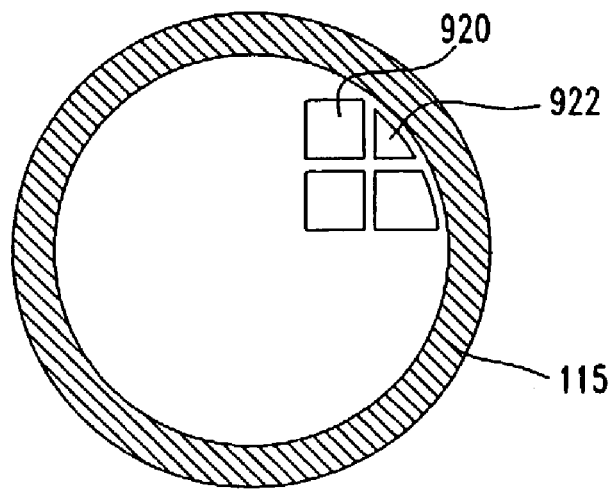
FIG. 9 shows a top view of a wafer that has been processed according to the invention.

FIG. 9 shows a top view of a wafer exposed according to a preferred embodiment of the invention. There, it can be seen that the rim 115 is a uniform piece of material that covers part of some chip patterns 922 at the edge of the wafer. Since the rim was exposed by rotating the wafer underneath the fiber carrying the carbonizing radiation, rim 115 has a smooth, circular edge.

Figure 7:
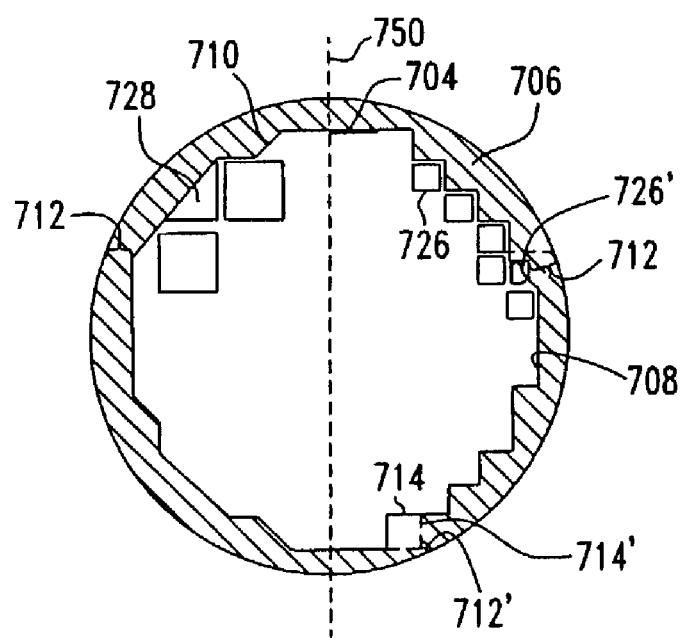
FIG. 7 shows a top view of a wafer processed according to an alternative embodiment of the invention.

FIG. 7 shows a corresponding top view of a wafer processed according to an alternative embodiment of the invention. Referring back to FIG. 5, an optional feature denoted generally by bracket 520 replaces the optical fiber 540 for directing radiation on to the wafer. Two mirrors 515 and 517 are mounted to deflect the beam 150 in two orthogonal directions, such as along x and y directions or along a radial direction and perpendicular to the radius. The radiation then travels directly from the second mirror without passing through fiber 540. Such an arrangement permits coverage of a broader exposure range on the wafer than the diameter of fiber 540.

The wafer in FIG. 7 is divided in half with a dashed vertical line 750 in order to illustrate two embodiments of the invention. On the right, the tool that exposes material 110 does not have the capability of exposing an area having a 45 degree line (or other diagonal line) as an edge; i.e. it can only define vertical lines 708 and horizontal lines 704. Accordingly, the blocking area 706 comes to the edge of the chips 726. If desired, the area 706 could be defined to approach the wafer edge up to a minimum distance 712 shown on the right side of the wafer, with a partial chip 726' filling the gap between the nearest full chip 726 and the blocking area, which would increase the area that is patterned up to a maximum and approach the wafer edge more uniformly than if partially exposed chip patterns were not used.

At the lower portion of the Figure, a line 714 is shown as an alternative to a line 714'. The line 714' would come too close to the wafer edge—i.e. the distance between the wafer edge and the closest chip, denoted as 712', would be too small if a full chip were patterned along line 714'. This location would have a more uniform heat load if a partial chip were used, similar to that shown on the right side of the Figure.

On the left side of the figure, the exposing tool is assumed to have a 45 degree capability, so that diagonal lines 710 (at 45 degrees or at other angles) can be drawn. This capability permits a closer approach to the wafer rim in various locations and can permit the exposure of a complete chip in some instances, and permit the more uniform exposure of partial chips (and thus more uniform heat loading) in other cases. Such a partial chip 728 is indicated at the left side of the Figure.

Two different sizes of chips are shown for purposes of illustration. Those skilled in the art will be aware that if the tool 500 in FIG. 5 has precision position control, the length of individual lines can be made quite small and therefore coverage of the wafer can quite closely approximate a uniform ring of blocking material having the minimum distance 712. Such precision control is quite expensive, and it may be that it is preferable to use a tool that has less precision and can expose a pattern with much less precision, but is much less expensive. Precision placement takes time that decreases the throughput for this exposure operation and thus increases the cost of practicing the invention.

Since the effectiveness of resist 110 is destroyed by carbonization, it does not matter if the resist is positive or negative. The blocking material 110 may be any positive tone photoresist or negative tone photoresist.

An exposure tolerance for material 112 (i.e. a tolerable variation in the inner radius of material 112, shown as bracket 114 in FIG. 3) is about 0.1 mm in contemporary technology. The primary consideration is not the precision of location, since this alignment is non-critical, but the amount of area that cannot be printed with entire chips because of the need to allow for a margin of safety so that a production chip is not ruined by being projected on to the edge of blocking material 112.

It is an advantageous feature of the invention, that the same resist is used to define rim 115 and also to define the pattern in the central portion of the wafer. In the example illustrated, the resist used for the deep trench pattern is a positive resist, so a positive resist is preferred to define rim 115. In some cases, it may be necessary to use a resist that does not have this dual capability, in which case, the central resist would be stripped and an appropriate second or pattern resist would be put down to receive the pattern of that layer of the circuit.

After the etching step, the integrated circuit fabrication process continues with conventional steps suitable for completing a bipolar, CMOS, biCMOS, etc. integrated circuit; e.g. forming DRAM cells, forming planar transistors, one or more levels of the back end processing and packaging. Those skilled in the art will appreciate that the invention is not confined to DRAM processing or even to integrated circuits (for example the invention may be used in micromachining mechanical objects) and may be used with any etching process that has an adverse effect on the underlying layers of material on a region of the wafer. For example, though the etching process is more aggressive at the rim, there could be processes where the need for the invention is found in the interior of the wafer.

While the invention has been described in terms of a single preferred embodiment, those skilled in the art will recognize that the invention can be practiced in various versions within the spirit and scope of the following claims.

What is claimed is:

1. A method of manufacturing a set of integrated circuits on a wafer comprising the steps of:
    preparing an integrated circuit substrate;
    depositing a layer of photosensitive material having a blocking thickness over said wafer;
    irradiating said photosensitive material in a blocking area at the outer edge of said wafer with a radiation dose such that said photosensitive material in said blocking area is desensitized;
    developing said photosensitive material to leave a layer of blocking material in said area;
    exposing a layer of patterning photoresist inside said blocking area with a set of images of a component pattern of a component of said set of integrated circuits;
    etching said wafer through said component pattern, while said blocking material blocks etching in said blocking area; and
    continuing with processing said set of integrated circuits.

2. A method according to claim 1, in which said photosensitive material is carbonized by said radiation dose.

3. A method according to claim 2, in which said photosensitive material is disposed over a layer of etch-resistant material.

4. A method according to claim 2, in which said photosensitive material is positive tone photoresist.

5. A method according to claim 2, in which said radiation dose is delivered by deflecting said radiation along two orthogonal axes, so that said blocking area has an inner boundary comprising a set of edges at right angles.

6. A method according to claim 1, in which said photosensitive material and said patterning photoresist are the same, so that said photosensitive material receives said set of images.

7. A method according to claim 6, in which said photosensitive material is disposed over a layer of etch-resistant material.

8. A method according to claim 6, in which said photosensitive material is positive tone photoresist.

9. A method according to claim 1, in which said images of said component pattern are images of deep trench apertures in DRAM cells.

10. A method according to claim 1, in which said photosensitive material is disposed over a layer of etch-resistant material.

11. A method according to claim 1, in which said photosensitive material is positive tone photoresist.

12. A method according to claim 1, in which said radiation dose is delivered by rotating said wafer about its center, so that said blocking area has an inner boundary comprising a circle.

13. A method according to claim 1, in which said radiation dose is delivered by deflecting said radiation along two orthogonal axes, so that said blocking area has an inner boundary comprising a set of edges at right angles.

* * * * *